United States Patent
Herbin et al.

(10) Patent No.: US 10,520,154 B2
(45) Date of Patent: Dec. 31, 2019

(54) LIGHTING DEVICE FOR A MOTOR VEHICLE PROVIDED WITH A GUIDED ELECTRICAL CABLE HARNESS

(71) Applicant: VALEO VISION BELGIQUE, Meslin l'Eveque (BE)

(72) Inventors: Cyril Herbin, Meslin l'Eveque (BE); Frederick Delgrange, Meslin l'Eveque (BE)

(73) Assignee: VALEO VISION BELGIQUE, Meslin l'Eveque (BE)

( * ) Notice: Subject to any disclaimer, the term of this patent is extended or adjusted under 35 U.S.C. 154(b) by 0 days.

(21) Appl. No.: 16/023,599

(22) Filed: Jun. 29, 2018

(65) Prior Publication Data
US 2019/0003672 A1    Jan. 3, 2019

(30) Foreign Application Priority Data
Jun. 29, 2017   (FR) ...................................... 17 56074

(51) Int. Cl.
*F21V 21/00* (2006.01)
*F21S 41/19* (2018.01)
(Continued)

(52) U.S. Cl.
CPC ........... *F21S 41/192* (2018.01); *F21S 41/143* (2018.01); *F21S 41/285* (2018.01); *F21S 45/10* (2018.01);
(Continued)

(58) Field of Classification Search
CPC .......... F21S 41/192; F21S 43/14; F21S 45/10; F21S 41/143; F21S 41/141; F21S 41/285;
(Continued)

(56) References Cited

U.S. PATENT DOCUMENTS

2005/0254257 A1\* 11/2005 Long .................... G02B 6/0001
362/581
2016/0295713 A1\* 10/2016 Hwang .................... H05K 5/02
(Continued)

FOREIGN PATENT DOCUMENTS

DE          197 04 067 A1      8/1998
DE    10 2009 018 445 A1    10/2010
(Continued)

OTHER PUBLICATIONS

French Preliminary Search Report dated Mar. 23, 2018 in French Application 17 56074, filed on Jun. 29, 2017 (with English Translation of Categories of cited documents).

*Primary Examiner* — Laura K Tso
(74) *Attorney, Agent, or Firm* — Oblon, McClelland, Maier & Neustadt, L.L.P.

(57) ABSTRACT

Lighting device for a motor vehicle, including: a housing, a printed circuit provided with at least one light source of light-emitting diode type, and provided with an electromagnetic shielding cage, the printed circuit extending along a printed circuit plane and being fixed inside the housing, an electrical cable harness fixed by a first end to the printed circuit and fixed by a second end to the housing, characterized in that the electrical cable harness has a run whose projection along an axis at right angles to the printed circuit plane does not intersect the projection of the cage along the axis at right angles to the printed circuit plane and in that the electrical cable harness includes a portion extending parallel to a lateral edge of the cage.

20 Claims, 8 Drawing Sheets

(51) Int. Cl.
*F21S 45/10* (2018.01)
*F21S 41/143* (2018.01)
*F21S 41/20* (2018.01)
*H01B 7/00* (2006.01)
*H05K 5/00* (2006.01)
*H05K 5/02* (2006.01)
*H05K 9/00* (2006.01)
*H01R 13/74* (2006.01)

(52) U.S. Cl.
CPC .......... *H01B 7/0045* (2013.01); *H05K 5/0069* (2013.01); *H05K 5/0217* (2013.01); *H05K 5/0247* (2013.01); *H05K 9/0024* (2013.01); *H01R 13/743* (2013.01)

(58) Field of Classification Search
CPC .... F21V 23/002; F21V 23/009; F21V 23/023; B60Q 1/0088; H01B 7/0045; H05K 5/0069; H05K 5/0217; H05K 5/0247; H05K 9/0024; H01R 13/743

USPC ......................................................... 362/548
See application file for complete search history.

(56) References Cited

U.S. PATENT DOCUMENTS

| | | |
|---|---|---|
| 2016/0372233 A1 | 12/2016 | Faoucher et al. |
| 2017/0009954 A1 | 1/2017 | Ueno et al. |
| 2018/0031198 A1 | 2/2018 | Krick et al. |

FOREIGN PATENT DOCUMENTS

| | | |
|---|---|---|
| EP | 2 266 845 A1 | 12/2010 |
| EP | 2 360 424 A1 | 8/2011 |
| EP | 2 848 860 A1 | 3/2015 |
| EP | 3 109 537 A1 | 12/2016 |
| FR | 3 032 516 A1 | 8/2016 |
| JP | 2006-302714 | 11/2006 |
| JP | 2014-135158 | 7/2014 |

* cited by examiner

LIGHTING DEVICE FOR A MOTOR VEHICLE PROVIDED WITH A GUIDED ELECTRICAL CABLE HARNESS

TECHNICAL FIELD OF THE INVENTION

The present invention relates to a lighting device for a motor vehicle. The invention relates also to a motor vehicle comprising such a lighting device. The invention relates also to a method for mounting such a lighting device in a motor vehicle.

STATE OF THE ART

Motor vehicles include an increasing number of electrical or electronic equipment items performing different functions. The operation of an electrical or electronic equipment item generates electromagnetic disturbances that can provoke malfunctions in other equipment items. For this reason, maximum electromagnetic wave emission thresholds are imposed on each electrical or electronic equipment item. There are also disturbance thresholds on the cables powering the equipment item in order to avoid malfunctions on the other equipment items using the same power source. In particular, the lighting devices of a motor vehicle have to satisfy certain electromagnetic wave emission and conducted emission criteria on the power cables.

The lighting devices also have to meet aesthetic demands. These demands can be reflected by a particular choice of light source such as, for example, light-emitting diodes, a particular arrangement of the light sources within the lighting device. Furthermore, in order to increase convenience of use, one and the same lighting device has to be able to operate according to several lighting modes that are differentiated for example by lighting intensity or by the activation of different light sources within the lighting device. Finally, the lighting devices are subject to demands of bulk in order to use the smallest possible space within the vehicle.

OBJECT OF THE INVENTION

The aim of the invention is to provide a lighting device and a method for mounting the lighting device that make it possible to optimally meet the demands mentioned above for the lighting devices and for the mounting methods known from the prior art. In particular, the invention makes it possible to produce a device and a method for mounting the device which are simple to implement.

To this end, the invention relates to a lighting device for a motor vehicle, comprising:
  a housing,
  a printed circuit provided with at least one light source, notably a light source of light-emitting diode type, and provided with an electromagnetic shielding cage, the printed circuit extending along a printed circuit plane and being fixed inside the housing,
  an electrical cable harness fixed by a first end to the printed circuit and fixed by a second end to the housing, the electrical cable harness having a run whose projection along an axis at right angles to the printed circuit plane does not intersect the projection of the cage along the axis at right angles to the printed circuit plane and the electrical cable harness comprising a portion extending along the cage, notably parallel to a lateral edge of the cage.

The housing can comprise at least one rib intended to guide the run of the electrical cable harness inside the housing.

The at least one rib can form with the housing a single-piece assembly, notably a single-piece assembly produced in injection moulded plastic.

The housing can comprise two ribs intended to guide the run of the cable harness inside the housing, the housing comprising a bottom extending along a plane substantially parallel to the printed circuit plane, a first rib extending from the bottom of the housing parallel to the axis at right angles to the printed circuit plane, the housing comprising a lateral edge extending along a plane substantially at right angles to the printed circuit plane, a second rib extending from the lateral edge of the housing parallel to the printed circuit plane.

The electrical cable harness can comprise an electromagnetic shielding, notably a ferrite core.

The lighting device can comprise a rear optical assembly comprising at least one collimator, notably a collimator of Fresnel type, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

The rear optical assembly and the front optical assembly can each take the form of a single single-piece part each comprising at least one securing means.

The invention relates also to a motor vehicle comprising a lighting device as defined previously.

Finally, the invention relates also to a method for mounting a lighting device comprising the following steps:
  a) production of a printed circuit provided with an electromagnetic shielding cage and provided with at least one light source, notably a light source of light-emitting diode type;
  b) production of an electrical cable harness;
  c) production of a housing provided with a first rib and a second rib, notably production of the housing by plastic injection moulding;
  d) fixing of a first end of the electrical cable harness to the housing (6);
  e) fixing of a second end of the electrical cable harness to the printed circuit (22);
  f) positioning of the electrical cable harness between a first rib and a lateral edge of the housing, and/or
  g) positioning of the electrical cable harness between a second rib and a bottom of the housing;
  h) fixing of the printed circuit inside the housing.

The step "f" can be performed after the step "d" and after the step "e".

The step "g" can be performed after the step "d" and after the step "e".

The step "h" can be performed after the step "f" and after the step "g".

BRIEF DESCRIPTION OF THE DRAWINGS

These objects, features and advantages of the present invention will be explained in detail in the following description of a particular embodiment given as a nonlimiting example in relation to the attached figures in which.

DESCRIPTION OF PREFERRED EMBODIMENTS OF THE INVENTION

Throughout the figures and the description, a reference frame linked to a motor vehicle is defined. The left and the right are defined according to the point of view of a driver. The axis X designates the longitudinal axis of the vehicle. When running forward and in a straight line, the vehicle progresses from back to front in a direction parallel to its longitudinal axis. The axis X is oriented from the front to the back of the vehicle, that is to say in the reverse direction. The axis Y designates the transverse axis of the vehicle. The axis Y is oriented from left to right. The axis Z designates the axis at right angles to the axis X and to the axis Y. The axis Z is a vertical axis when the vehicle rests on a horizontal ground. The axis Z is oriented upwards. The axes X, Y and Z form a direct orthonormal reference frame. The longitudinal axis X is therefore at right angles to the vertical and transverse plane YZ. Throughout the figures and the description, the vehicle is considered to rest on a horizontal ground. This same reference frame will be able to be used to describe a lighting device even when considered outside of the vehicle since it is intended to be mounted according to a particular orientation in the vehicle.

Figure 1:
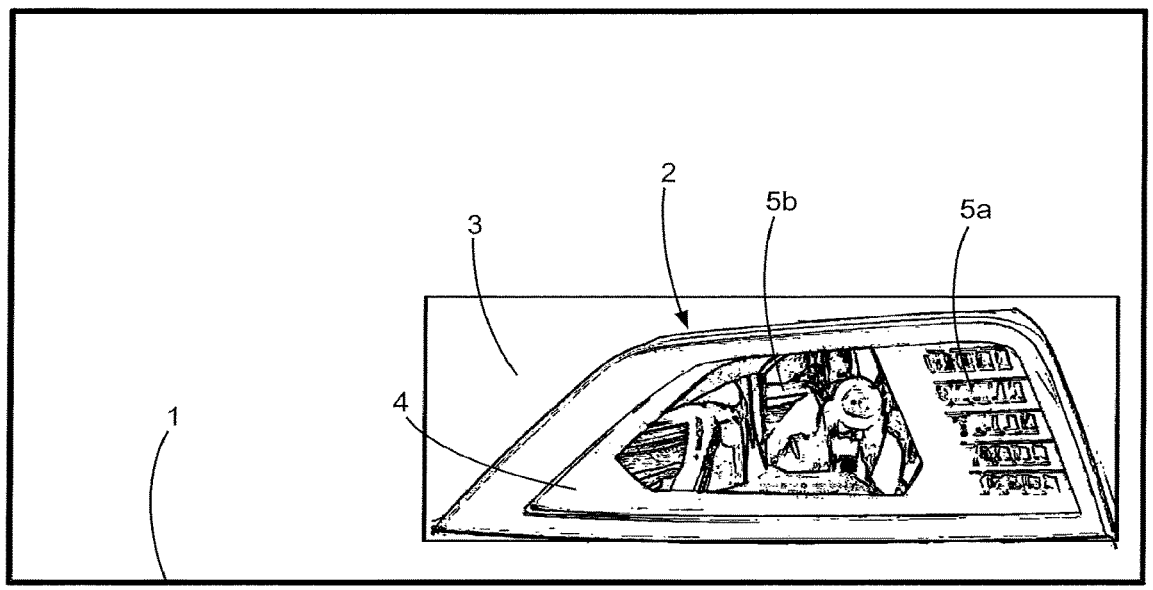
FIG. 1 is a schematic front view of a motor vehicle according to an embodiment of the invention.
Figure 1:
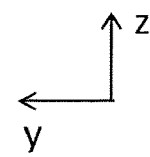

FIG. 1 schematically illustrates a motor vehicle 1 provided with a lighting device 2 according to an embodiment of the invention. The lighting device is a headlight and will be able to be thus referred to hereinafter in the document. The headlight illustrated is the front left headlight. The vehicle can also comprise a front right headlight produced symmetrically on the right of the vehicle and/or one or more headlights at the rear of the vehicle equipped with an embodiment of the invention. The vehicle could also be a truck, a bus, an industrial vehicle, a motorcycle or any other type of vehicle provided with a headlight. In order to simplify the description, the front left headlight will be described. This description could easily be transposed to a front right headlight, to a rear right headlight or to a rear left headlight.

The headlight can comprise a position light, a low beam, a high beam, a fog lamp, an indicator or any other light source contributing to the lighting of the vehicle and/or to the lighting of the road. Seen from the front, the headlight has an overall trapezoidal form with a substantially horizontal long base toward the bottom and a small base also substantially horizontal and toward the top but the headlight could have any other form. The headlight is fixed to a body of the vehicle and can be surrounded by coachwork 3 of the vehicle. The headlight comprises a translucent or transparent front face 4 protecting it from external attack. According to the embodiment presented, the headlight comprises two compartments 5a, 5b positioned side-by-side. A first compartment 5a can for example comprise a lighting of position light or low beam or daytime running light type. A second compartment 5b, positioned to the right of the first compartment 5a, can for example comprise a lighting of high beam or fog light type.

Figure 2:
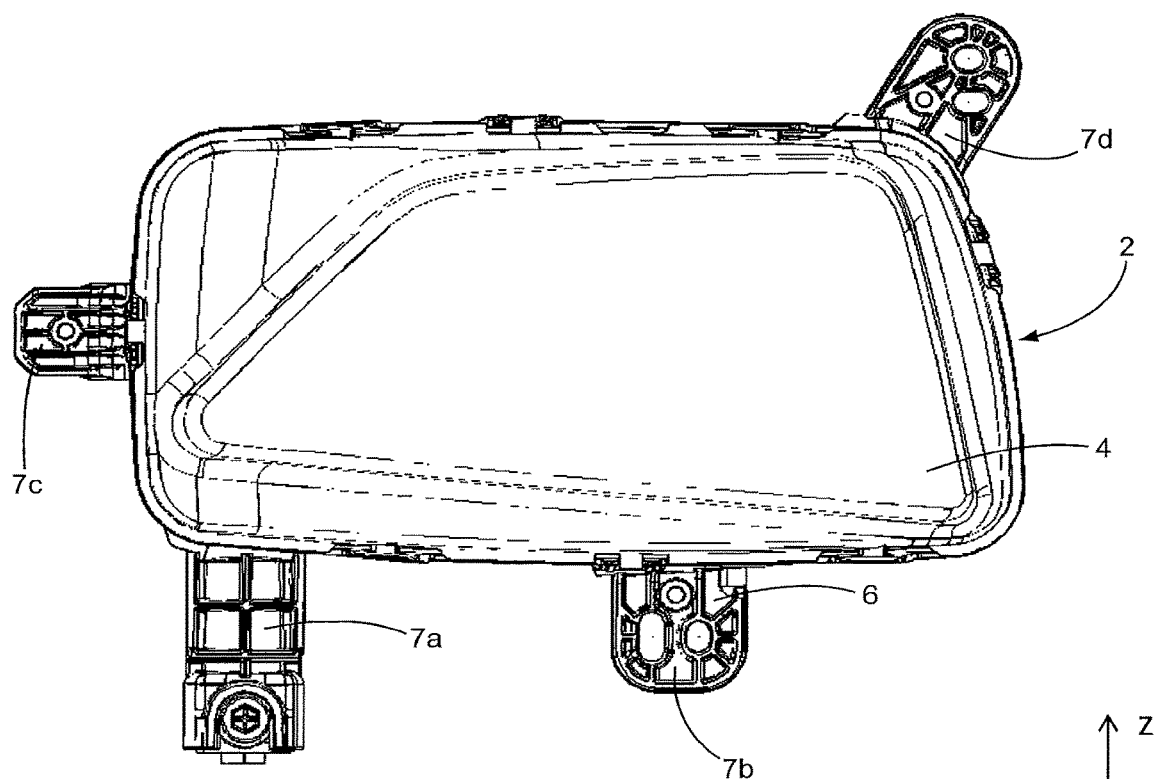
FIG. 2 is a front view of a headlight of the vehicle according to an embodiment of the invention.
Figure 2:
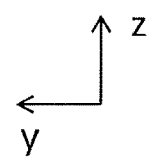

FIG. 2 schematically illustrates the headlight outside of the vehicle. The headlight comprises a housing 6 onto which the front face 4 is fixed. The housing 6 comprises fixing means for fixing to the vehicle. In this particular case, the housing comprises four fixing tabs 7a, 7b, 7c, 7d. Two fixing tabs 7a, 7b extend vertically from a bottom edge of the headlight. A third fixing tab 7c extends from a lateral edge to the right. A fourth fixing tab 7d extends from a top left corner upwards and to the left. Thus, the headlight can be rigidly fixed to the vehicle, notably to the body of the vehicle.

Figure 3:
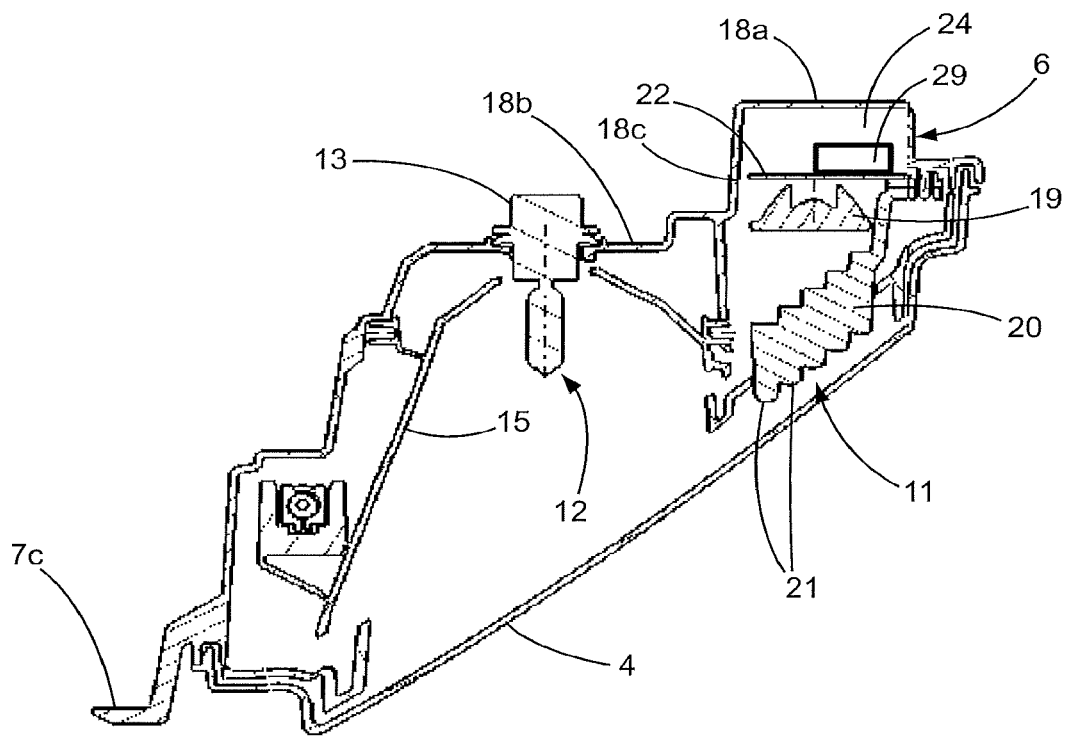
FIG. 3 is a schematic plan view of the headlight according to a longitudinal and transverse cross section.
Figure 5:
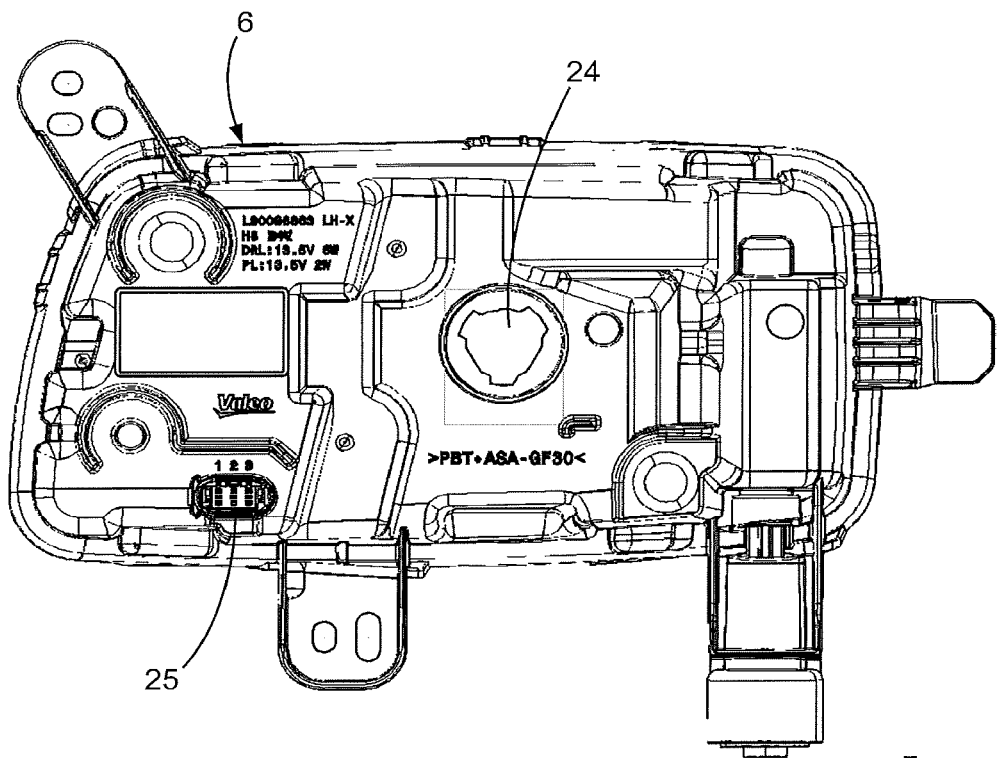
FIG. 5 is a view of the rear of the headlight.
Figure 5:
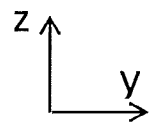

FIG. 3 illustrates a cross-sectional and plan view of the headlight. The first compartment 5a comprises a first optical module 11 according to an embodiment of the invention. The second compartment comprises a second optical module 12. The second optical module comprises a light source, in this case a light bulb 13, for example of H8 type. The light bulb can for example be a halogen bulb or a light-emitting diode bulb. The light bulb is fixed through an opening 14 produced in a bottom of the housing. Such an opening is particularly visible in FIG. 5. Furthermore, the second optical module 12 comprises reflecting surfaces 15 forming a funnel around the light bulb and extending to the front face 4. The front face is common to the first and to the second optical modules. The front face extends along a plane roughly comprising the vertical axis Z and an oblique axis in relation to the transverse axis Y.

The housing 6 is generally a housing produced from injection-moulded plastic. The housing forms an enclosure closed at the front by the front face 4. The housing can comprise one or more sealing chicanes at the interface with the front face. According to the embodiment represented, the housing is a single-piece part made of plastic enclosing the first and the second optical modules. The housing comprises a common wall 17 between the first and the second optical modules. The housing comprises a first bottom 18a at the rear of the first optical module and a second bottom 18b at the rear of the second optical module. The first and the second bottoms extend along planes parallel to the vertical axis Z and to the transverse axis Y. The first bottom is offset relative to the second bottom. The first bottom is positioned more to the rear than the second bottom. As a variant, the headlight could comprise only a single optical module or more than two optical modules. The headlight could also comprise a housing specific to each optical module.

Hereinbelow, the first optical module will more simply be called "the optical module" and the "first bottom" will be more simply called "the bottom". The optical module is notably visible according to a perspective cross-section in FIG. 4. The optical module 11 comprises a part of the housing 6 in which is housed a printed circuit 22 provided with at least one light source 23, a front optical assembly 20 and a rear optical assembly 19. The rear optical assembly 19 comprises at least one collimator, notably a collimator of Fresnel type. The front optical assembly 20 is distinct from the rear optical assembly. The front optical assembly is provided with a front face comprising at least two transverse lighting surfaces 21 arranged at different levels in the longitudinal direction to form at least two treads of an overall staircase form. The front optical assembly is stacked in direct contact with the rear optical assembly. The rear optical assembly and the front optical assembly are each in the form of a single single-piece part each comprising at least one means for securing to the housing.

The printed circuit extends along a printed circuit plane YZ parallel to the bottom 18*a* of the housing. That is to say, the printed circuit extends substantially parallel to the vertical axis Z and to the transverse axis Y. A volume 24 is delimited between the bottom 18*a*, the printed circuit and lateral edges of the housing. A right lateral edge 18*c* is positioned in the extension of the common wall 17.

The at least one light source can be at least one light-emitting diode. Preferentially, the optical module comprises a set of light-emitting diodes. The optical module can be capable of producing different lighting modes. For example, a first lighting mode can correspond to a position light and a second lighting mode can correspond to a daytime running light. The different lighting modes can be distinguished by the number of light-emitting diodes activated, the position of the activated light-emitting diodes, or even the light power delivered by each light-emitting diode.

Figure 4:
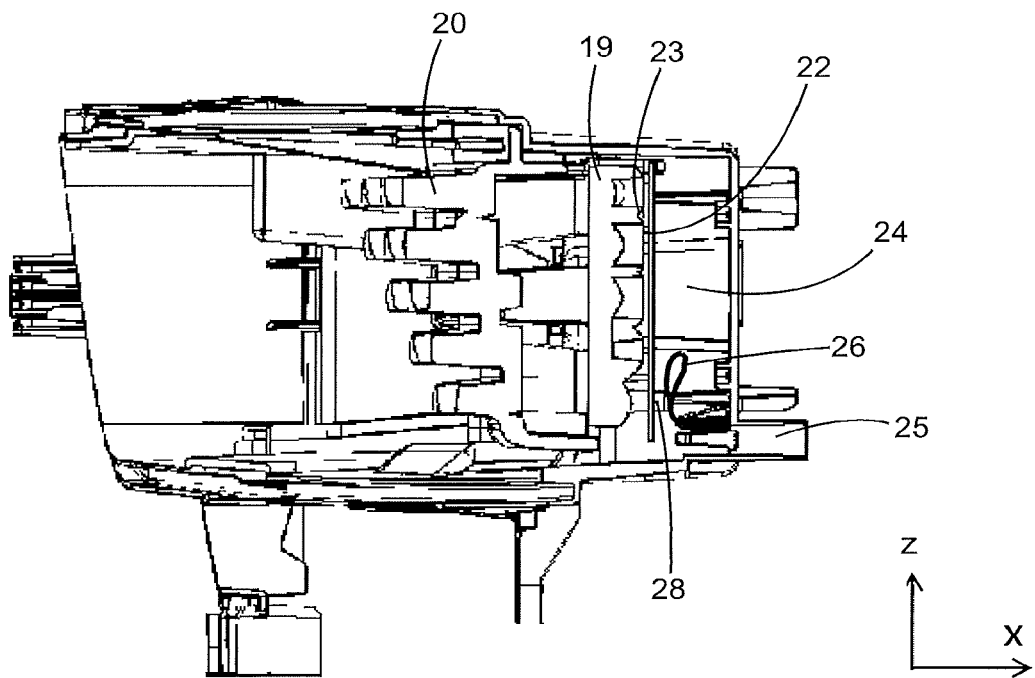
FIG. 4 is a schematic view in cross section of a side of the headlight.
Figure 10:
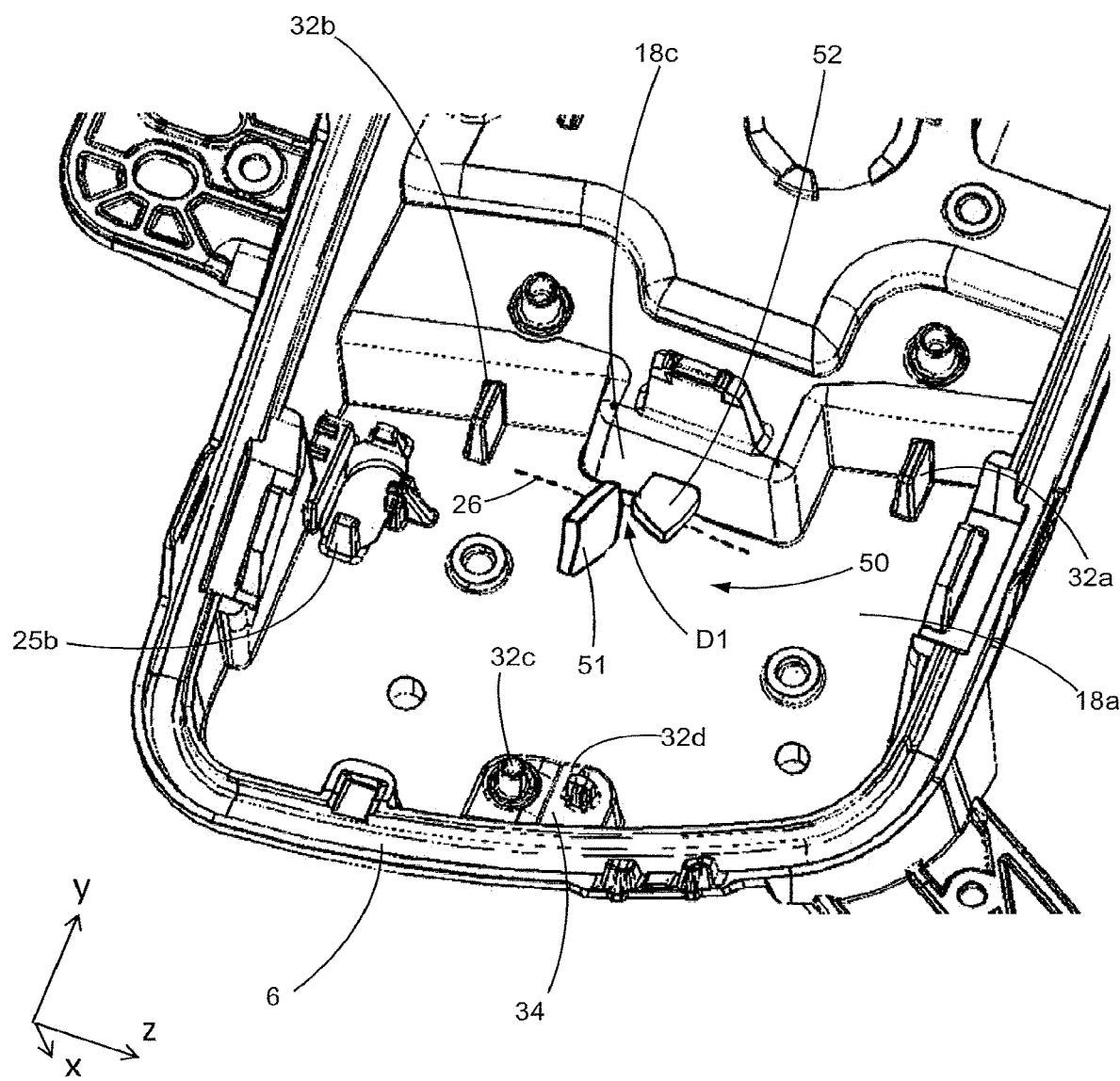
FIG. 10 is a partial view of the housing.

As can be seen particularly in FIG. 4, a first connector 25 passes through the bottom of the housing along an axis substantially parallel to the axis X. The first connector comprises a first part positioned outside the housing intended to be connected to a secondary electrical cable harness. The first connector is an element distinct from the housing. The first connector is fixed to the housing by a snap-fitting means 25*b* that is particularly visible in FIG. 10. Thus, the headlight can be connected electrically to other members of the vehicle, notably to an electronic control unit, and/or to an electrical power supply device. The first connector also comprises a second part positioned inside the housing and linked to an electrical cable harness 26. The electrical cable harness 26 comprises a first end linked to the first connector 25 and a second end linked to the printed circuit via a second connector 28. As a variant, the light device could have no connector or have a single connector. For example, the cables of the electrical cable harness could be soldered to the printed circuit, or even the electrical cable harness could simply pass through the housing, for example through a cable entry, and be linked outside the housing to other members of the vehicle.

The first connector is oriented along the longitudinal axis X and passes through the bottom of the housing. The first connector is situated in proximity to the bottom right corner of the housing. The second connector is also oriented along the longitudinal axis X on the printed circuit. The second connector is situated in proximity to the bottom right corner of the printed circuit. The first connector and the second connector are therefore positioned very close to one another when the printed circuit is assembled with the housing. The distance separating the first connector from the second connector is clearly less than the length of the electrical cable harness. It is worth noting that if the length of the electrical cable harness had been limited to the distance separating the first connector from the second connector, the assembly of the first connector with the housing and/or of the second connector with the printed circuit would be impossible. Indeed, there would not be enough space between the printed circuit and the housing to make these connections.

The electrical cable harness comprises three electrical cables of the same length. The minimum length of the electrical cable harness can be defined so as to be able to fix, without difficulty, the first connector to the housing and/or the second connector to the printed circuit when assembling the optical module. The maximum length of the cable harness can be defined to optimize the quantity of cable used. The electrical cables are not fixed together but are all three linked by a first end to the first connector and by a second end to the printed circuit. The electrical cables can be metal wires surrounded by an insulating sheath. Moreover, the electrical cable harness could comprise any other number of electrical cables greater than or equal to one.

Figure 6:
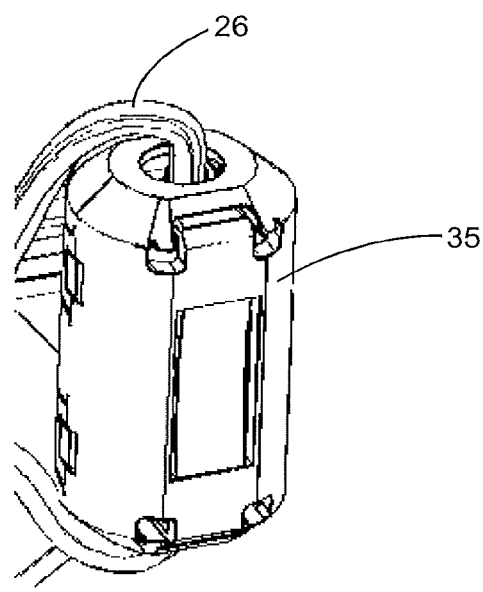
FIG. 6 is a perspective view of a ferrite core surrounding the electrical cable harness according to an alternative embodiment of the invention.
Figure 6:
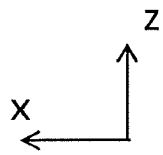

As a variant, the electrical cable harness could also comprise a ferrite core 35 as represented in FIG. 6. The ferrite core comprises a metal solid of revolution provided with a central aperture through which the electrical cable harness passes. The ferrite core can for example take the form of a ring or even of a cylinder provided with a cylindrical central aperture. The ferrite core can comprise two half-cylinders hinged by a hinge so as to be able to be opened to mount it around the electrical cable harness. Thus, the ferrite core does not need to be threaded through by an end of the electrical cable harness to be assembled with the electrical cable harness. As a variant, the ferrite core could surround only some of the cables of the electrical cable harness.

According to another variant, possibly complementing the preceding one, the electrical cable harness could comprise a sheath jacketing, at least locally, all of the cables in order for the run of each cable to be parallel to the run of the other cables. The sheath could also include an electromagnetic shielding, for example in the form of a metal braid surrounding all the cables.

The printed circuit comprises a first face to which the at least one light source 23 is fixed. The rear optical assembly is positioned against the first face of the printed circuit. The first face is turned towards the front of the vehicle. The printed circuit comprises a second face, turned towards the rear, to which the electrical cable harness is fixed. The electrical cable harness can be connected to the second face of the printed circuit via metal pins 27 arranged at the end of each cable of the cable harness inserted into the second connector 28. These pins are particularly visible in FIGS. 7 and 8. The pins are oriented along the longitudinal axis X. The pins are connected to the printed circuit via the second connector fixed to the rear second face of the printed circuit.

The second face of the printed circuit also comprises a set of electronic components forming a driver for the power supply, notably a power converter of chopper type comprising a coil. The electronic components can also form a driver for driving the at least one light source. These electronic components and the tracks which link them together are primarily responsible for the emissions. These electronic components are surrounded by an electromagnetic shielding cage 29, also called Faraday cage. The printed circuit can also comprise other electronic components outside the cage on the first face or on the second face of the printed circuit. It is specified that the connector 28 is not inside the cage 29. The electrical cable harness does not therefore pass through the cage.

Figure 7:
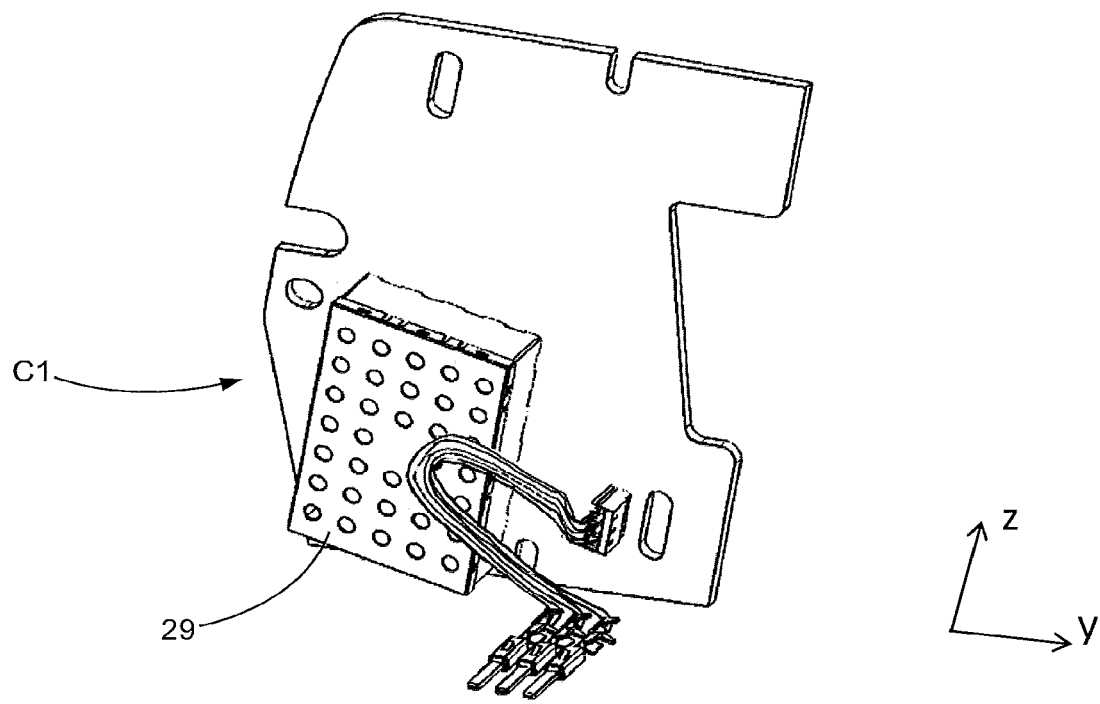
FIG. 7 is a first schematic view of a printed circuit and of an electrical cable harness according to a configuration not corresponding to the invention.
Figure 8:
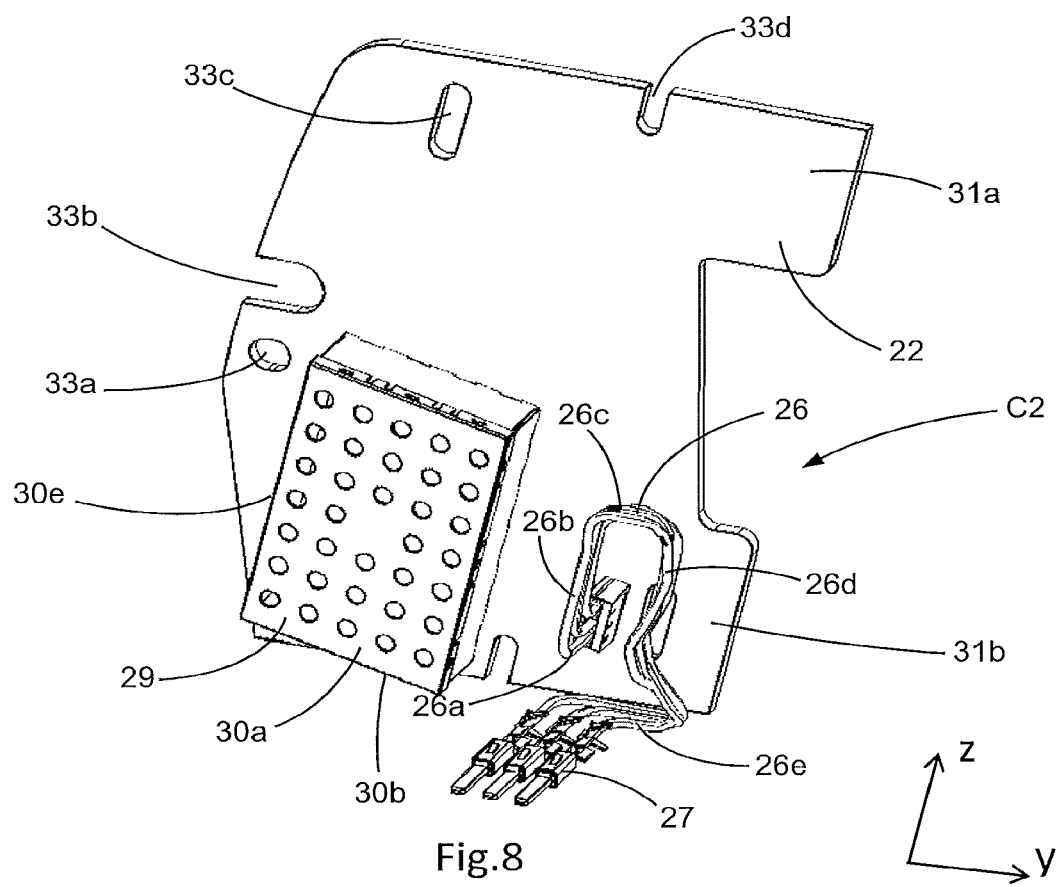
FIG. 8 is a second schematic view of a printed circuit and of an electrical cable harness according to an embodiment of the invention.

The cage, particularly visible in FIGS. 7 and 8, can have an overall parallelepipedal form. The cage is positioned at the bottom of the printed circuit, to the left of the second connector. The cage can have a length greater than its width and the width greater than its height. The length is substantially oriented along the vertical axis Z. The width is substantially oriented along the transverse axis Y. The height of the cage is substantially oriented along the longitudinal axis X. Thus, it is possible to distinguish a rear face 30a of the cage extending along a plane substantially parallel to the plane of the printed circuit. It is also possible to distinguish a bottom lateral side 30b, a top lateral side 30c, a right lateral side 30d and a left lateral side 30e. As a variant, the cage could have any other form, for example a cylindrical form or a polygonal form. The cage is generally produced from steel sheets, or any other conductive material. The steel sheets can be drilled with evenly distributed circular holes as is the case here on the rear face 30a.

The form of the printed circuit can, at least roughly, follow the form of the housing. Thus, according to the embodiment presented, the printed circuit has an overall rectangular form with a first extension 31a to the right from a top right corner of the printed circuit and with a second extension 31b to the right from a bottom right corner of the printed circuit. The right lateral edge 18c of the housing comprises a profile following the profile of the right edge of the printed circuit. With the housing having a form complementing the printed circuit, it is thus possible to ensure that the printed circuit is correctly oriented in the housing. In particular, it would be impossible to assemble the printed circuit in the housing with a quarter-turn rotation.

The housing also comprises pillars 32a, 32b, 32c, 32d extending parallel to the longitudinal axis X and making it possible to accurately define the position of the printed circuit inside the housing. The printed circuit can bear on a first pillar 32a via a first extension 31a. The printed circuit can bear on a second pillar 32b via a second extension 31b. The printed circuit can also include openings 33a, 33b, notably oblong or circular openings. A first opening 33a can cooperate with a third pillar 32c and a second opening 33b can cooperate with a fourth pillar 32d to lock the position of the printed circuit in relation to the vertical axis Z and in relation to the transverse axis Y. The third pillar 32c and the fourth pillar 32d can also be used to fix the rear optical assembly 19 and the front optical assembly 20 to the housing. Other openings 33c, 33d produced in the printed circuit can be used to fix the rear optical assembly 19 against the printed circuit. The printed circuit can also bear on the base 34 common to the third and fourth pillars. The first pillar, the second pillar and the base form three bearing points for the printed circuit and thus define the printed circuit plane. Thus, the position of the printed circuit in relation to the housing is fully defined. The position and the orientation of the at least one light source is precise.

The electrical cable harness is contained in the volume 24. In the absence of a guiding means, the electrical cable harness could follow any run inside the volume 24. The run of the electrical cable harness can be governed by the position of the first and of the second connector as well as by the rigidity of the cables that make up the electrical cable harness. Thus, in a first configuration C1, a run of the electrical cable harness can be illustrated in FIG. 7. Note that the cable harness passes behind the cage. The projection of the cable harness along the longitudinal axis X intersects the projection of the cage along the longitudinal axis X. The cable harness produces a "U-shaped" loop when it passes behind the case. Despite the electromagnetic shielding cage 29, a part of the power radiated by the electronic components inside the cage reaches the cable harness creating disturbances conducted in the cable harness which then becomes an antenna and produces electromagnetic disturbances.

For a given configuration of the cable harness and for a given lighting mode, it is possible to measure the electromagnetic radiation emitted by the optical module. Such a measurement can be performed for example according to an international standard or according to a standard of a motor vehicle constructor defining the acceptable electromagnetic emission thresholds. The strength of the electromagnetic field can be represented as a function of its frequency on a logarithmic graph. More specifically, it is possible to represent, on the one hand, a measurement corresponding to a time average of the strength of the electromagnetic field as a function of the frequency. On the other hand, it is possible to represent a measurement corresponding to a peak value or a quasi-peak value of the strength of the electromagnetic field as a function of the frequency. The international standard or the standard of the motor vehicle constructor defines maximum electromagnetic field strength thresholds as a function of the frequency. The international standard or the standard of the motor vehicle constructor also defines maximum voltage thresholds as a function of the frequency for the conducted emissions.

The containment of the lighting devices and the positioning constraints or even the nature of the light sources render the electromagnetic wave emission thresholds more difficult to comply with.

Figure 11:
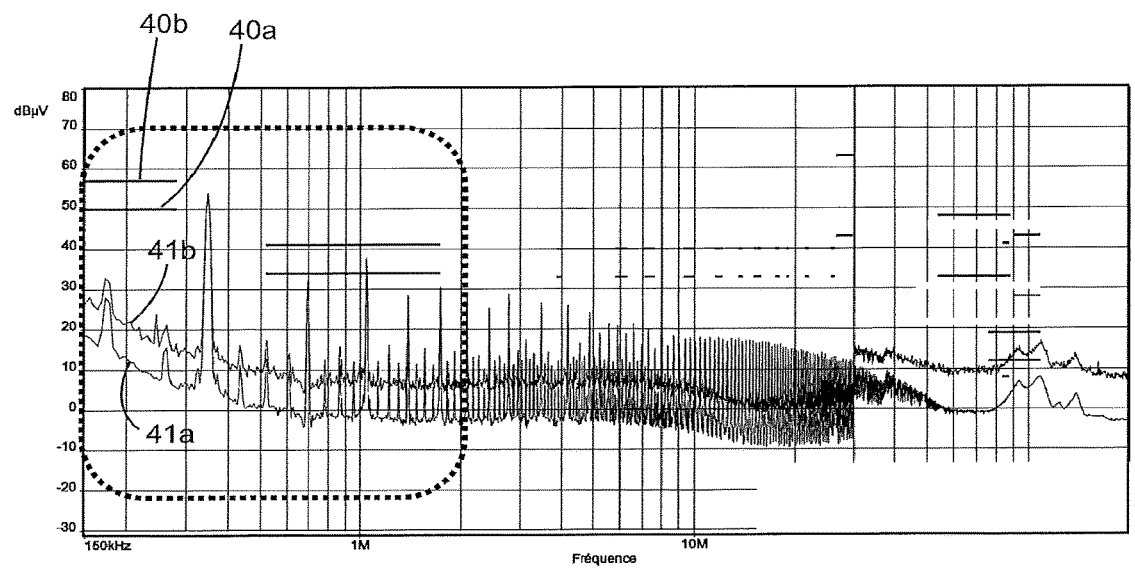
FIG. 11 is a graph of measurements of conducted emissions of a headlight in a first lighting mode, the headlight being provided with an electrical cable harness in a first configuration not corresponding to the invention.

Thus, FIG. 11 represents a graph of the average voltage 41a and of the peak voltage 41b of the conducted emissions of the optical module over a frequency band lying between 150 kHz and 200 MHz for the first lighting mode and with the first configuration of the electrical cable harness. The graph also comprises the maximum thresholds for the average voltage levels 40a and for the peak voltage levels 40b defined by the international standard or by the standard of the motor vehicle constructor. Note that the conducted emissions exceed the thresholds defined by the standard, notably for a frequency band in the region of 1.1 MHz.

Figure 12:
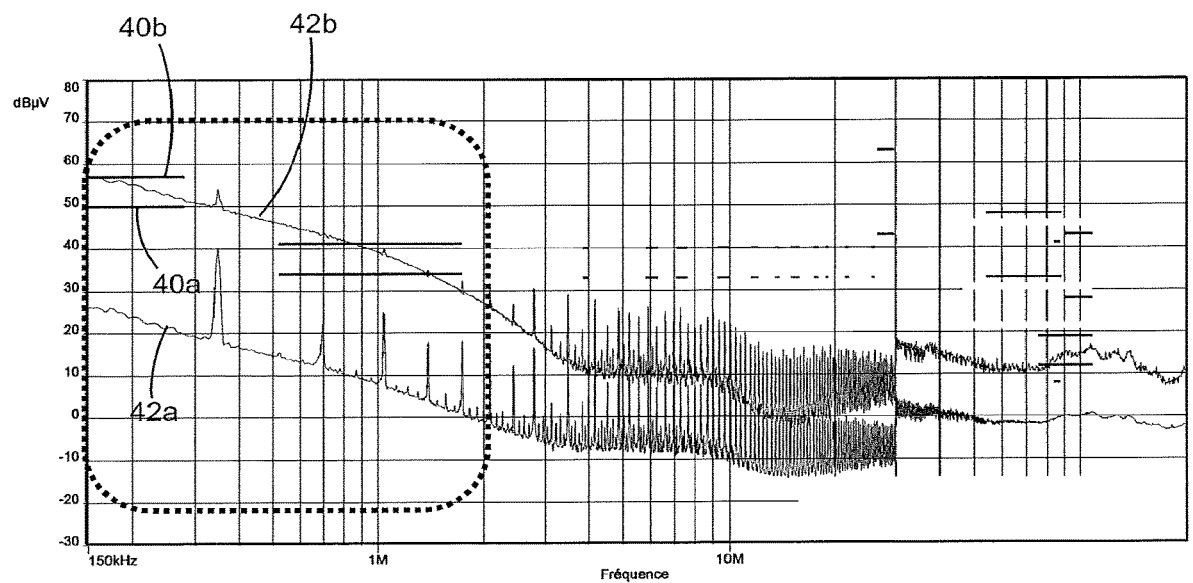
FIG. 12 is a graph of measurements of conducted emissions of a headlight in a second lighting mode, the headlight being provided with an electrical cable harness in a first configuration not corresponding to the invention.

Similarly, FIG. 12 represents a graph of the average voltage 42a and of the peak voltage 42b of the conducted emissions of the optical module over a frequency band lying between 150 kHz and 200 MHz for the second lighting mode and with the first configuration of the electrical cable harness. The graph also comprises the maximum thresholds for the average voltage levels 40a and for the peak voltage levels 40b defined by the international standard or by the standard of the motor vehicle constructor. Note that the conducted emissions exceed the thresholds defined by the standard, notably for a frequency band in the region of 530 kHz.

Figure 9:
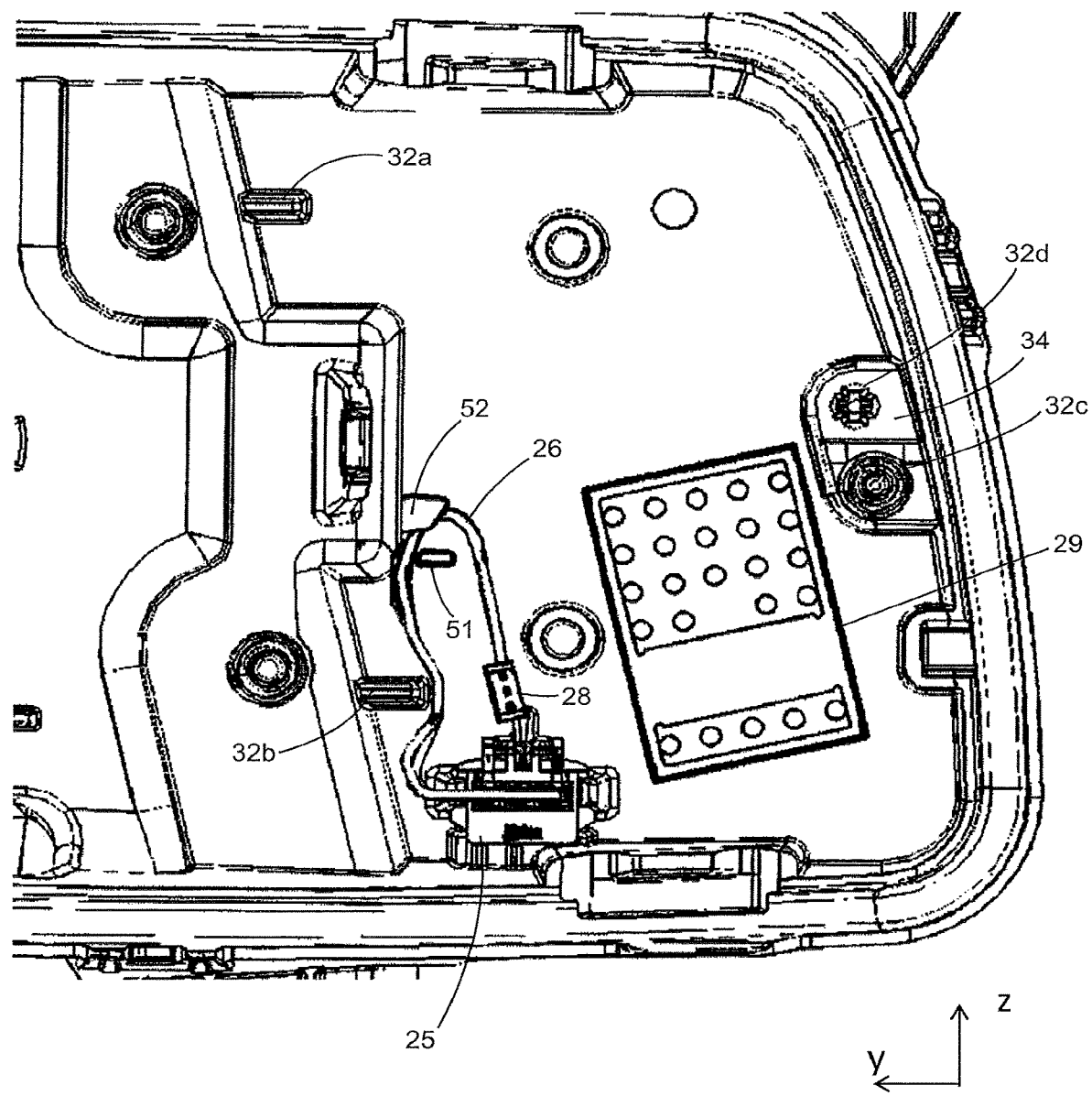
FIG. 9 is a partial view of the headlight comprising a housing, an electrical cable harness and an electromagnetic shielding cage according to an embodiment of the invention.

It has been found that, by modifying the run of the electrical cable harness inside the volume 24, the electromagnetic emission spectrum of the optical module is also modified. It is possible to define a second configuration C2 of the run of the electrical cable harness, in which the projection of the cable harness along the longitudinal axis X does not intersect the projection of the cage along the longitudinal axis X but runs along the right lateral edge 30d of the cage. The second configuration is particularly visible in FIG. 8 and in FIG. 9. In FIG. 9, the printed circuit has been made invisible in order to show the run of the electrical cable harness in relation to the cage. By considering the run of the electrical cable harness from the second connector, that is to say the connector fixed to the printed circuit, to the first connector, that is to say the connector fixed to the housing, it is possible to distinguish different sections of the electrical cable harness, differentiated by changes of direction of the electrical cable harness. The changes of direction can be for example bends of angles of approximately equal to 90°. In a first section 26a, the electrical cable harness emerges at right angles to the printed circuit plane YZ. In a second section 26b, the electrical cable harness runs upwards running along the right lateral edge 30d of the cage parallel to the printed circuit plane. In a third section 26c, the electrical cable harness is oriented from left to right parallel to the printed circuit plane. In this third section, the electrical cable harness moves away from the cage, but, as a variant, it could also move towards it but without passing behind the cage. In a fourth section 26d, the electrical cable harness runs downwards running along the right lateral edge 18c of the housing, parallel to the printed circuit plane. Finally, in a fifth and last section 26e, the electrical cable harness is oriented at right angles to the printed circuit plane to enter into the first connector. Thus, the cable harness is folded back on itself and does not describe a loop behind the cage that can be coupled with the magnetic field of the main coil of the power converter. The electrical cable harness is at a distance from the cage and does not describe a loop at right angles to the electromagnetic field lines originating from the cage. The area of the projection of the electrical cable harness along the longitudinal axis X is much smaller than for the first configuration C1 of the run of the electrical cable harness. As a variant, the cable harness could run along any other lateral edge of the cage.

In order to obtain a run of the electrical cable harness according to the second configuration, a cable harness guiding means 50 is incorporated in the housing. In particular, the guiding means can be incorporated into the bottom of the housing and at the right lateral edge of the housing, level with a portion of the cable harness extending along the vertical axis Z, along the right edge of the cage. The guiding means 50 is particularly illustrated in FIGS. 9 and 10.

To this end, the housing comprises a first rib 51 extending from the bottom 18a of the housing parallel to the axis at right angles to the printed circuit plane. The first rib therefore extends along the longitudinal axis X from the bottom of the housing. The first rib has an overall rectangular form and extends also parallel to the transverse axis Y. The first rib is positioned at approximately mid-height from the bottom of the housing along the vertical axis Z and in proximity to the right lateral edge 18c of the housing. A first space in which the electrical cable harness is housed separates the first rib from the right lateral edge. The electrical cable harness passes between the first rib 51 and the right lateral edge 18c. Thus, the first rib produces a securing of the electrical cable harness along the transverse axis Y.

The housing also comprises a second rib 52 extending from the right lateral edge 18c of the housing parallel to the printed circuit plane. The second rib therefore extends along the transverse axis Y and along the vertical axis Z. The second rib has an overall rectangular form and is positioned at approximately mid-height of the lateral edge of the housing between the bottom of the housing and the printed circuit along the longitudinal axis X. A second space in which the electrical cable harness is housed separates the second rib from the bottom. The electrical cable harness passes between the second rib 52 and the bottom 18a of the housing. Thus, the second rib produces a securing of the electrical cable harness along the longitudinal axis X. The second rib is positioned facing the first rib. A space D1 separates the first rib from the second rib allowing the passage of the electrical cable harness in the mounting operation. The space can be adjusted according to the thickness of the cable harness to allow it to be passed between the two ribs. The mounting of the electrical cable harness between the two ribs may require a local deformation of the ribs or of the cable harness in order to guarantee an effective retention of the electrical cable harness once put in place.

As a variant, the housing could comprise only a single rib out of the first or the second rib. A rib could include a notch intended to receive the cable harness. The housing could also comprise more ribs and other means for guiding the cable harness distributed throughout its run.

Preferentially, the first and the second ribs are produced of a single piece with the housing in one and the same plastic injection moulding operation. To this end, the injection mould may comprise mould slides making it possible to produce the ribs. For example, the injection mould may comprise a mould slide that is mobile along the transverse axis Y. As a variant, the first rib and/or the second rib could be elements produced separately and fixed (for example snap-fitted or glued) to the housing.

The electromagnetic emissions of the optical module when the run of the electrical cable harness is in the second configuration can then be measured.

Figure 13:
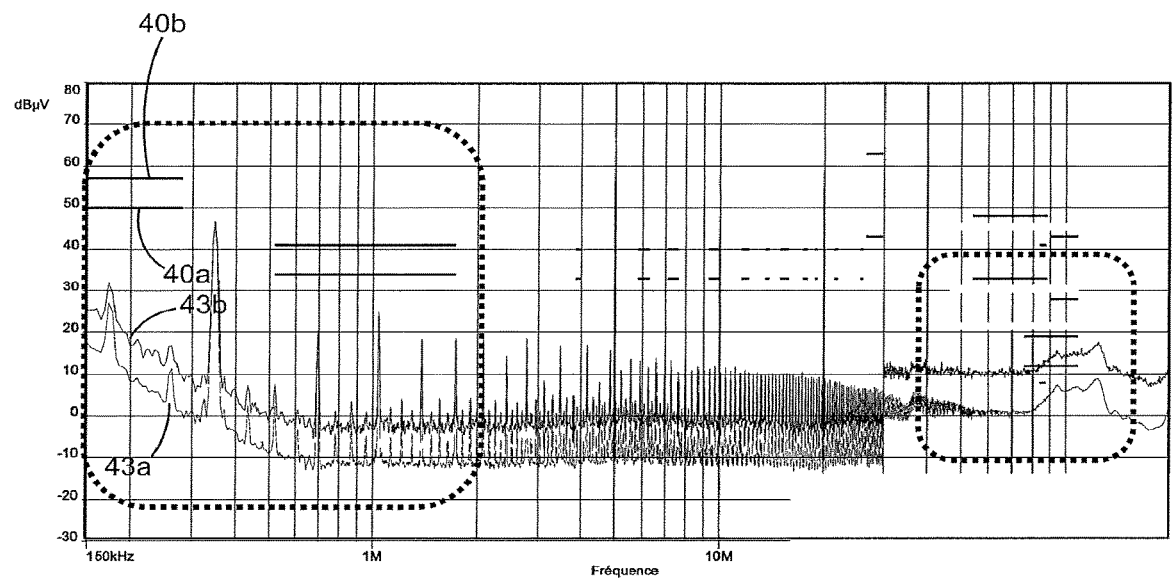
FIG. 13 is a graph of measurements of conducted emissions of the headlight in a first lighting mode, the headlight being provided with an electrical cable harness according to an embodiment of the invention.

FIG. 13 represents a graph of the average voltage 43a and of the peak voltage 43b of the conducted emissions of the optical module over a frequency band lying between 150 kHz and 200 MHz for the first lighting mode and with the second configuration of the cable harness. The graph also comprises the maximum thresholds for the average voltage levels 40a and for the peak voltage levels 40b defined by the international standard or by the standard of the motor vehicle constructor. It can be seen that the conducted emissions comply with the thresholds defined by the standard.

Figure 14:
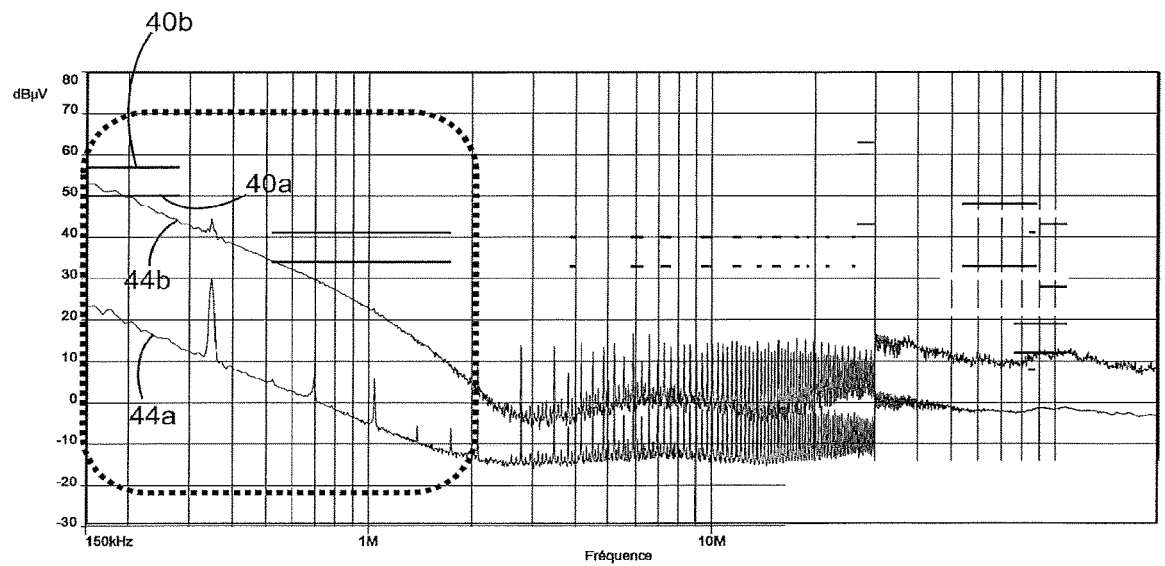
FIG. 14 is a graph of measurements of conducted emissions of the headlight in a second lighting mode, the headlight being provided with an electrical cable harness according to an embodiment of the invention.

Similarly, FIG. 14 represents a graph of the average voltage 44a and of the peak voltage 44b of the conducted emissions of the optical module over a frequency band lying between 150 kHz and 200 MHz for the second lighting mode and with the second configuration of the cable harness. The graph also comprises the maximum thresholds for the average voltage levels 40a and for the peak voltage levels 40b defined by the international standard or by the standard of the motor vehicle constructor. It can be seen that the conducted emissions comply with the thresholds defined by the standard.

The invention relates also to a method for mounting an optical module comprising the following steps referenced from "a" to "h".

a) In a first step, the printed circuit provided with the light source fixed onto the front first face and provided with the electromagnetic shielding cage fixed onto the rear second face of the printed circuit is produced. As a variant, the light source could be fixed to the printed circuit in another step.

b) In a second step, the electrical cable harness is produced.

c) In a third step, the housing provided with the first rib and the second rib is produced. In particular, the production of the housing can be performed by injection of plastic into an injection mould.

d) In a fourth step, the first end of the electrical cable harness is fixed to the housing. In particular, this operation can consist in a snap-fitting of the first connector 25 to the snap-fitting means 25*b*.

e) In a fifth step, the second end of the electrical cable harness is fixed to the printed circuit. In particular, this operation can consist in the insertion of the pins 27 of the electrical cable harness into the connector 28 fixed to the printed circuit.

f) In a sixth step, the electrical cable harness is positioned between the first rib and the edge of the housing.

g) In a seventh step, the electrical cable harness is positioned between the second rib and the bottom of the housing.

On completion of the step "f" and of the step "g", the electrical cable harness is positioned along the cage according to the second configuration.

h) In an eighth step, the printed circuit is fixed inside the housing. In particular, this step comprises the insertion of the pillars 32*c*, 32*d* of the housing into the corresponding openings 33*a*, 33*b* of the printed circuit. At the end of this step, the cable harness is contained in the volume 24 made inaccessible by the fixing of the printed circuit. The risk of the electrical cable harness leaving its guidance between the first rib and the edge of the housing and between the second rib and the bottom of the housing is therefore very low.

Preferentially, the steps of the mounting method observe the following order:

The step "f" can be performed after the step "d" and after the step "e".

The step "g" can be performed after the step "d" and after the step "e".

The step "h" is performed after the step "f" and after the step "g".

However, it would also be possible to fix at least one of the ends of the cable harness after having run the electrical cable harness between the first rib and the edge of the housing and between the second rib and the bottom of the housing.

By virtue of the invention, a lighting device is made available that is capable of producing several lighting modes. The bulk of this device is limited and the electromagnetic wave emissions of the device allow it to be incorporated in a vehicle without disturbing the operation of the other electrical or electronic members of the vehicle. The cost of such a lighting device remains moderate because there is no point in adding expensive components to limit the emission of conducted waves.

The invention claimed is:

1. Lighting device for a motor vehicle, comprising:
a housing,
a printed circuit provided with at least one light source, and provided with an electromagnetic shielding cage, the printed circuit extending along a printed circuit plane and being fixed inside the housing,
an electrical cable harness fixed by a first end to the printed circuit and fixed by a second end to the housing,
wherein the electrical cable harness has a run whose projection along an axis at right angles to the printed circuit plane does not intersect the projection of the cage along the axis at right angles to the printed circuit plane and the electrical cable harness comprises a portion extending along the cage parallel to a lateral edge of the cage.

2. Lighting device according to claim 1, wherein the housing comprises at least one rib configured to guide the run of the electrical cable harness inside the housing.

3. Lighting device according to claim 2, wherein the at least one rib forms with the housing a single-piece assembly, the single-piece assembly being produced with injection-molded plastic.

4. Lighting device according to claim 1, wherein the housing comprises two ribs configured to guide the run of the cable harness inside the housing, the housing comprising a bottom extending along a plane substantially parallel to the printed circuit plane, a first rib extending from the bottom of the housing parallel to the axis at right angles to the printed circuit plane, the housing comprising a lateral edge extending along a plane substantially at right angles to the printed circuit plane, a second rib extending from the lateral edge of the housing parallel to the printed circuit plane.

5. Lighting device according to claim 1, wherein the electrical cable harness comprises an electromagnetic shielding.

6. Lighting device according to claim 1, wherein the lighting device comprises a rear optical assembly comprising at least one Fresnel collimator, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

7. Lighting device according to claim 6, wherein the rear optical assembly and the front optical assembly each take the form of a single-piece part each comprising at least one securing means.

8. Motor vehicle comprising a lighting device according to claim 1.

9. Method for mounting a lighting device comprising the following steps:
(a) production of a printed circuit provided with an electromagnetic shielding cage and provided with at least one light source;
(b) production of an electrical cable harness;
(c) production of a housing provided with a first rib and a second rib said production of housing by plastic injection molding;
(d) fixing of a first end of the electrical cable harness to the housing;
(e) fixing of a second end of the electrical cable harness to the printed circuit;
at least one of
(f) positioning of the electrical cable harness between a first rib and a lateral edge of the housing; and
(g) positioning of the electrical cable harness between a second rib and an edge of the housing; and
(h) fixing of the printed circuit inside the housing.

10. Mounting method according to claim 9, wherein at least one of the following:
the step "f" is performed after the step "d" and after the step "e";
the step "g" is performed after the step "d" and after the step "e"; and
the step "h" is performed after the step "f" and after the step "g".

11. Lighting device according to claim 2, wherein the housing comprises two ribs configured to guide the run of the cable harness inside the housing, the housing comprising a bottom extending along a plane substantially parallel to the printed circuit plane, a first rib extending from the bottom of the housing parallel to the axis at right angles to the printed circuit plane, the housing comprising a lateral edge extending along a plane substantially at right angles to the printed circuit plane, a second rib extending from the lateral edge of the housing parallel to the printed circuit plane.

12. Lighting device according to claim 3, wherein the housing comprises two ribs configured to guide the run of the cable harness inside the housing, the housing comprising a bottom extending along a plane substantially parallel to the printed circuit plane, a first rib extending from the bottom of the housing parallel to the axis at right angles to the printed circuit plane, the housing comprising a lateral edge extending along a plane substantially at right angles to the printed circuit plane, a second rib extending from the lateral edge of the housing parallel to the printed circuit plane.

13. Lighting device according to claim 2, wherein the electrical cable harness comprises an electromagnetic shielding.

14. Lighting device according to claim 5, wherein the electromagnetic shielding comprises a ferrite core.

15. Lighting device according to claim 13, wherein the electromagnetic shielding comprises a ferrite core.

16. Lighting device according to claim 2, wherein the lighting device comprises a rear optical assembly comprising at least one Fresnel collimator, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

17. Lighting device according to claim 3, wherein the lighting device comprises a rear optical assembly comprising at least one Fresnel collimator, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

18. Lighting device according to claim 4, wherein the lighting device comprises a rear optical assembly comprising at least one Fresnel collimator, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

19. Lighting device according to claim 5, wherein the lighting device comprises a rear optical assembly comprising at least one Fresnel collimator, and a front optical assembly, distinct from the rear optical assembly, provided with a front face comprising at least two transverse lighting surfaces arranged at different levels in the longitudinal direction to form at least two treads of an overall staircase form, the front optical assembly being stacked in direct contact with the rear optical assembly.

20. Motor vehicle comprising a lighting device according to claim 2.

* * * * *